United States Patent [19]

Lockery et al.

[11] 4,138,882
[45] Feb. 13, 1979

[54] TRANSDUCER BRIDGE CIRCUIT ARRANGEMENT

[75] Inventors: Harry E. Lockery, Sudbury; Harold O. Ballou, Framingham, both of Mass.

[73] Assignee: Hottinger Baldwin Measurements, Inc., Natick, Mass.

[21] Appl. No.: 894,156

[22] Filed: Apr. 6, 1978

[51] Int. Cl.² ............................................. G01B 7/16
[52] U.S. Cl. ........................................ 73/767; 73/769
[58] Field of Search ..................................... 73/88.5 R

[56] References Cited

U.S. PATENT DOCUMENTS

| | | | |
|---|---|---|---|
| 2,478,720 | 8/1949 | Sourwine et al. | 73/88.5 R |
| 2,815,480 | 12/1957 | Ruge | 73/88.5 R |
| 3,166,135 | 1/1965 | Clamp | 73/88.5 R |
| 3,290,928 | 12/1966 | Curry | 73/88.5 R |

*Primary Examiner*—Anthony V. Ciarlante
*Attorney, Agent, or Firm*—W. G. Fasse; D. F. Gould

[57] ABSTRACT

A transducer bridge circuit arrangement includes at least two bridge circuits connected in parallel to each other. Any interaction affecting the sensitivity of the bridge circuits relative to each other is eliminated. For this purpose the circuit arrangement includes two power input terminals and two measured signal output terminals. In order to avoid a signal component, which represents force couple related load components between the two measured signal output terminals, these terminals are arranged on the one hand between the two strain gauges which measure tension or compression only and, on the other hand, between the two strain gauges which measure tension as well as compression. In such an arrangement the power input terminals and the measured signal output terminals are effectively rotated by 90° relative to prior art transducer circuit arrangements, whereby interaction between the individual bridge circuits in a multiple transducer system is eliminated.

4 Claims, 7 Drawing Figures

INVENTION

TRANSDUCER BRIDGE CIRCUIT ARRANGEMENT

BACKGROUND OF THE INVENTION

The present invention relates to a transducer bridge circuit arrangement. More specifically, the present circuit arrangement comprises a plurality of bridge circuit configurations arranged in parallel to each other. Each bridge circuit configuration comprises four strain gauges forming, for example, a bending strain transducer or a shearing strain transducer.

It is well known in the art of electrically measuring mechanical quantities to connect a plurality of transducers in parallel to each other. For example, U.S. Pat. No. 2,866,059 granted to Eric Laimins discloses transducers that may be connected in parallel to each other. The need for connecting transducers in parallel to each other exists, for example, in connection with a platform scale wherein one transducer is operatively interposed between the support structure and each corner of the scale platform.

In order to reduce the costs of such transducers, it is customary to permit a relatively wide range of sensitivity variations or a wide output calibration tolerance for each transducer of the same type. Such tolerance may be within the range of ± 15%. Due to this broad calibration tolerance range, it is necessary to adjust the sensitivity of the transducers of the same scale so that each transducer will provide the same output signal. Without such sensitivity adjustment, any one of these transducers may vary within the above tolerance range in its output signal thereby preventing an accurate weighing. Heretofore it was customary to connect a resistor, for example, in adjustable resistors such as a potentiometer in series with the transducer of a set of transducer. Such resistors were used particularly in series with the high output transducer to reduce that output down to that of the other transducers of the same set of transducers. However, the use of such series resistors in one transducer also affects the sensitivity of the other transducers in the same set as will be described in more detail below. Due to such interaction it was necessary heretofore to repeatedly readjust the transducers of a set of transducers until each transducer in a set would exhibit the desired sensitivity. Such repeated adjustments are time consuming and hence expensive. Moreover, even repeated adjustments do not eliminate the just described undesirable interaction. It would be desirable that the sensitivity of each transducer in a set can be adjusted independently of the sensitivity of any other transducers in a set.

OBJECTS OF THE INVENTION

In view of the above it is the aim of the invention to achieve the following objects singly or in combination:

to eliminate the disadvantages of the prior art, more specifically, to provide transducers which are not subject to the mentioned interaction;

to eliminate the mentioned interaction in the adjustment of the sensitivity of the individual transducers of a set of transducers without the addition of extra circuit components;

to eliminate the mentioned interaction without affecting the costs of each individual transducer; and to provide a circuit configuration which will eliminate the above mentioned interaction in bending transducers as well as in shear beam transducers and the like.

SUMMARY OF THE INVENTION

According to the invention there is provided a transducer bridge circuit arrangement wherein the two bridge circuits are connected in parallel and have common power input terminals and common measured signal output terminals. One measured signal output terminal is formed between a strain gauge measuring tension loads only and a strain gauge measuring compression loads only. The other measured signal output terminal is formed between two strain gauges, each of which measures compression and tension. The first power input terminal is formed between a strain gauge measuring tension only and a strain gauge measuring tension as well as compression. The second power input terminal is formed between a strain gauge measuring compression only and a strain gauge measuring tension as well as compression. In this new circuit configuration, the potentials at the measured signal output terminals do not vary relative to each other and no output signal component is added as a result of the presence of signal components which are due to the fact that the respective strain gauges are also sensing force couple related loads.

With the foregoing bridge wiring configuration the interaction between transducers when adjusting their sensitivity is reduced by an order of several magnitudes. For example, test results have shown that the interaction has been reduced fifty times as compared to the interaction present in prior art bridge circuit configurations. It is a particular advantage that no additional circuit components are required for this surprising reduction in interaction and that the costs remain unaffected by the improvement of the invention as far as the production of the transducers is concerned. However, substantial cost savings have been achieved in that the repeated sensitivity adjustments required heretofore have now been eliminated.

Yet another advantage is seen in that the present invention is equally applicable to bending beam transducers as well as shearing beam transducers which primarily sense shearing strains, and also sense superimposed strains resulting from a force couple effective on such transducers.

BRIEF FIGURE DESCRIPTION

In order that the invention may be clearly understood, it will now be described, by way of example, with reference to the accompanying drawings, wherein.

DETAILED DESCRIPTION OF THE PRIOR ART AND OF A PREFERRED EMBODIMENT OF THE INVENTION

Figure 1:
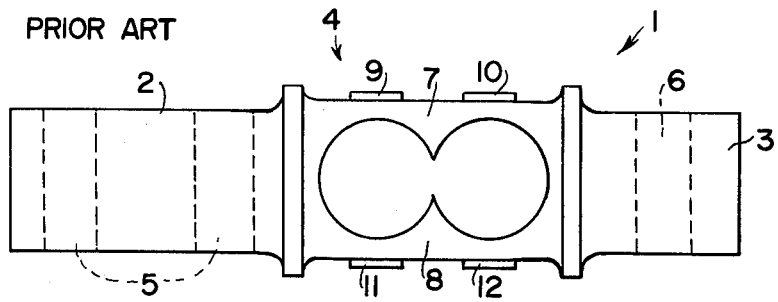
FIG. 1 illustrates, somewhat schematically, a conventional bending beam transducer.

FIG. 1 shows schematically a conventional transducer 1 comprising a connecting end 2 and a load application end 3 as well as a bendable section 4 located between the ends 2 and 3. The connecting end 2 is provided with holes 5 for securing the transducer to a support structure by conventional means not shown. The load application end 3 is provided with a hole 6 to which, for example, the platform of a scale may be secured. The bendable section 4 is formed by two flexural elements 7 and 8. The flexural element 7 carries two strain gauges 9 and 10. The flexural element 8 also carries two strain gauges 11 and 12. The strain gauges may, for example, be foil strain gauges which change their electrical resistance as the transducer is subjected to a load.

Figure 2:
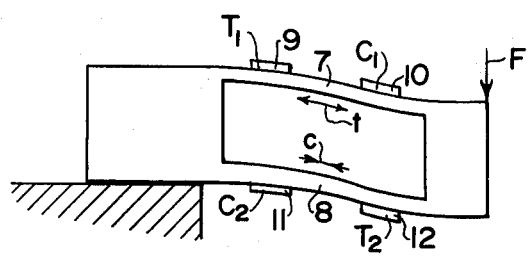
FIG. 2 illustrates symbolically the loads to which a bending beam transducer of the type shown in FIG. 1 is subjected in operation.

The load or force F shown in FIG. 2 bends the transducer whereby the transducer is subjected to superimposed loads. A tension stress $T_1$ is sensed by the strain gauge 9. A compression stress $C_1$ is sensed by the strain gauge 10. A further compression stress $C_2$ is sensed by the strain gauge 11. A further tension stress $T_2$ is sensed by the strain gauge 12.

In addition to the just mentioned stresses which result when the flexural elements 7 and 8 deflect in parallel under the influence of the load F, there are imposed on the transducer, tension and compression loads due to a force couple resulting from the application of the force F at the free end of the transducer. The force couple causes tensile loads "t" in the upper flexural element 7. Further, the force couple causes compression loads "c" in the flexural element 8.

Figure 3:
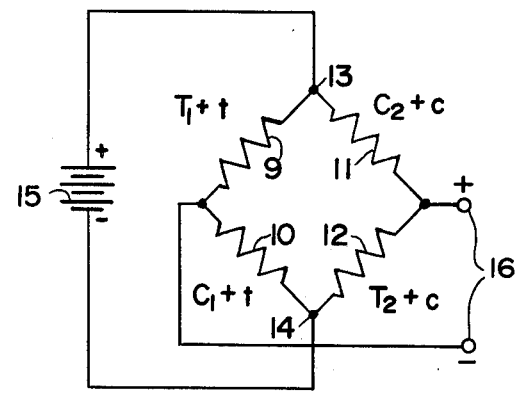
FIG. 3 is a conventional bridge circuit arrangement of the strain gauges of a transducer such as shown in FIG. 2.

FIG. 3 illustrates one conventional bridge circuit arrangement of the strain gauges. Power input terminals 13 and 14 are connected to a power supply such as a battery 15. A measured signal is available at the output terminals 16. As in FIG. 2, the bending deflection associated with loading are denoted by capital letters and the tensile and compressive strains due to the force couple are illustrated by lower case letters. The measured output signal has the illustrated polarity if the power supply polarity is as shown and if all of the strain gauges 9, 10, 11, and 12 are subject to the indicated strain components. In the circuit configuration of FIG. 3 no bridge unbalance is produced by the tension and compression components caused by the force couple because the components are equal and of opposite directions. Stated differently, the gauges 9 and 10, each have the same couple related tensile component and the potential of that corner of the bridge does not move up or down as the result of the couple related load components. The same applies to the compressive couple related strain or load components present on the gauges 11 and 12 and the respective loads $C_2$, $T_2$. Hence, there is no effect of the force couple on the measured signal output at the output terminals 16. Accordingly, the couple related load components cancel each other effectively in the illustrated prior art bridge circuit configuration of FIG. 3. Thus, no problems are encountered where only one transducer is used in a circuit configuration as shown in FIG. 3.

Figure 4:
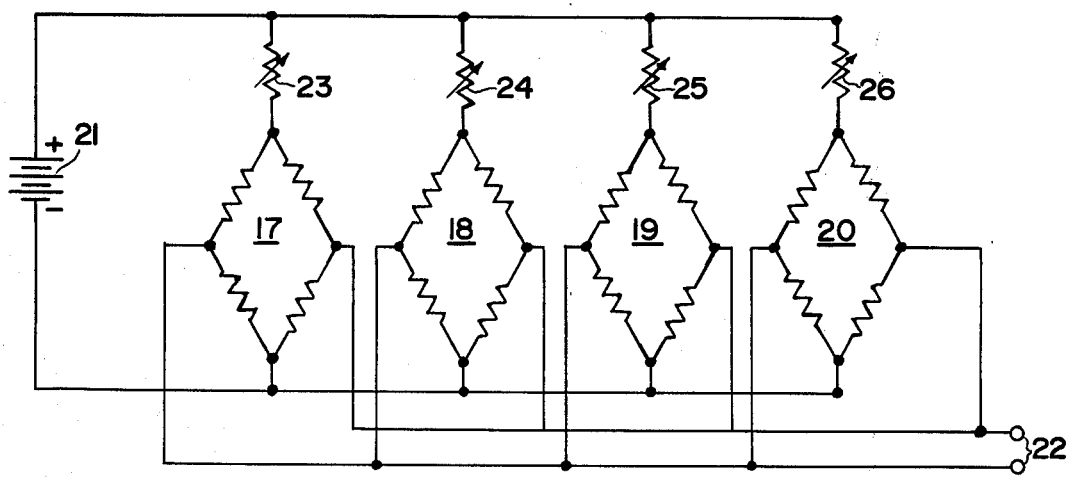
FIG. 4 illustrates a conventional circuit arrangement in which a plurality of bridge circuits such as shown in FIG. 3, are connected in parallel to each other and showing means for adjusting the sensitivity of each bridge circuit.

However, the above mentioned problem that a sensitivity adjustment of one transducer bridge circuit influences the sensitivity of other bridge circuits of a set of bridge circuits occurs when such bridge circuits are connected in parallel as shown in FIG. 4. FIG. 4 shows four bridge circuits 17, 18, 19, and 20 connected in parallel to each other and to a common power source 21. The measured signal appears at the output terminals 22. Each bridge circuit 17 to 20 is provided with a respective series, connected potentiometer 23, 24, 25, and 26. The illustrated bridge circuits may, for example, be connected to the corners of the platform of a weighing scale as mentioned above. It has been found that adjustment of any one of the potentiometers for the purpose of providing the same sensitivity for each of the bridges is difficult if not impossible due to an interaction. Thus, for example, adjustment of the potentiometer 23 not only affects the sensitivity of the bridge circuit 17, but also the sensitivity of the other bridge circuits and vice versa. Thus, the sensitivity adjustment of any of these potentiometers 23 to 26 is not independent of the other potentiometers. For example, when these transducers with the respective bridge circuits 17 to 20 are located at each corner of a scale platform the adjustment of the sensitivity of one corner transduser with a given weight applied to that corner affects the sensitivity of the other corners transducers when the weight has been applied at the other corners.

This undesirable phenomenon requires that the operator goes from corner to corner for the adjustment in a systematic manner. He has to repeat the operation several times. Even after such repetitious adjustment the over-all adjustment does not converge, so to speak, to a uniform sensitivity at each corner transducer.

According to the invention it has been found that such undesirable interaction is due to the nature of transducers such as bending or shear transducers as described above with reference to FIGS. 1 and 2. The strains $T_1$, $T_2$, $C_1$, and $C_2$ sensed by the gauges 9, 10, 11, and 12 are the strains resulting from deflecting, for example, a bending beam transducer. In addition, the above described strains resulting from the force couple are superimposed and the effect of such superimposed strains will now be described with reference to FIG. 5a and 5b each showing two bridge circuits connected in parallel.

Figure 5A:
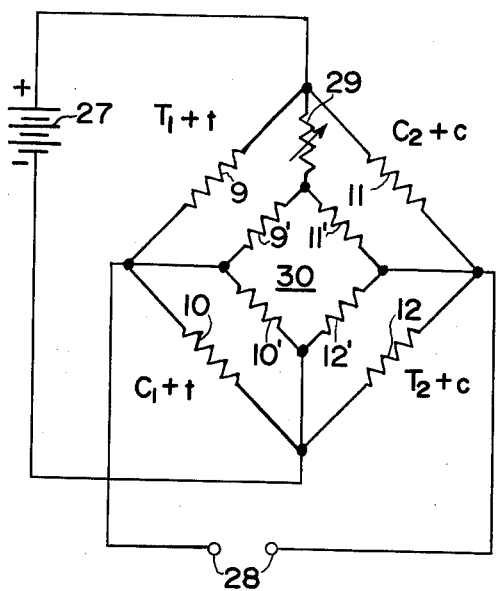
FIG. 5a and FIG. 5b illustrate other conventional bridge circuits connected in parallel to each other.
Figure 5B:
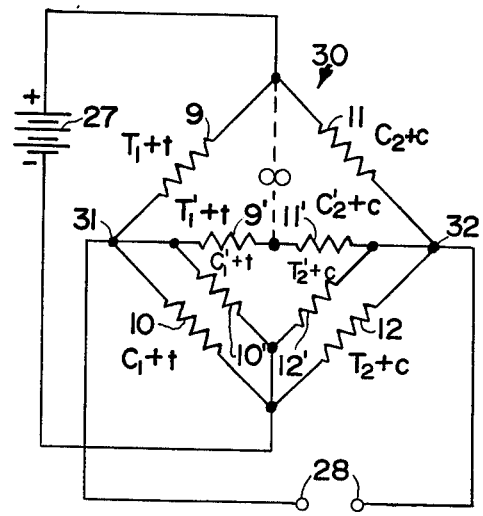

In FIGS. 5a and 5b the same reference numbers and designations are used as in FIG. 2 except that for the second bridge the reference numbers are provided with a prime. Both bridge circuits are connected to a common source of power such as battery 27 and the measured signal appears at the output 28. A potentiometer 29 is connected in series with the bridge circuit 30 comprising the resistors of the respective strain gauges 9', 10', 11', and 12'. The interaction conditions between the two bridges will be exaggerated to illustrate the reason for such interaction in the sensitivity adjustment of the bridges. In FIG. 5b the resistance of the potentiometer 29 of FIG. 5a has been increased to infinity. This corresponds to the removal of the potentiometer 29 as shown in FIG. 5b. As a result, the strain gauges 10 and 12 measuring the loads $C_1$ + t and $T_2$ + c are effectively shunted by corresponding strain gauges in the parallel bridge 30. Due to this shunting the couple related load components are not effectively cancelled as has been the case in FIG. 3. The shunting of the strain gauge 10 reduces the change in strain gauge resistance of the gauge 10 due to the couple related "t". Thus, the point 31 at the junction of the strain gauge resistors 9 and 10 does not remain at the same potential. Rather, the potential at this point and thus at the signal output terminals 28 decreases because the change in the gauge resistance due to the couple related component sensed by resistor 10 is less than by the resistor 9. On the other side of the bridge, the strain gauge 12 sensing the load components $T_2 + c$ is shunted by another strain gauge, whereby again the change due to the couple related component "c" is less than that in the resistor 11 which sense the components $C_2 + c$. Accordingly, the junction 32 between the strain gauges 11 and 12 is at a rising potential because resistor 11 will decrease more in resistance due to the couple component "c" than resistor 12. Resistor 12 changes less due to the shunting effect of the resistor 12' of the bridge 30. The polarities in the bridge circuits 5a and 5b are the same as described above with reference to FIG. 3. Therefore, the output due to the lack of cancellation of the couple related component will add to the original output due to the loads $T_1$, $T_2$, $C_1$, and $C_2$.

The net effect of the just described phenomenon is as follows. Assume that a transducer pair is arranged with the respective strain gauge resistors in a parallel bridge configuration as shown in FIGS. 5a and 5b. Assume further that the transducer represented by the outer bridge configuration is loaded by a specific load while the inner transducer is not loaded. The output is noted and recorded. Now the potentiometer 29 is opened or disconnected as shown in FIG. 5b. As a result, the output of the loaded transducer 9, 10, 11, 12 will increase by a substantial amount. Actual tests indicate that such increase may exceed 10% as compared to the original reading, when the sensitivity adjustment potentiometer is opened or removed. Such variations cannot be tolerated, for example, where transducers are used in a scale because the resulting weight display would be inaccurate.

The problem can be minimized by adjusting the sensitivity of the transducers prior to assembly in a scale to a narrower tolerance range, for example, 2 to 3%. However, even such more precise transducers merely minimize the problem without providing a complete removal of the problem, especially since in scales the adjustment of the corner transducers must be adjusted to a tolerance of less than 0.05%. Moreover, for cost reasons it is desirable that the transducers must not meet such a close tolerance range initially. Thus, where the initial tolerance range is ± 10 to 15%, considerable sensitivity adjustments will be necessary to minimize the above described interaction in parallel bridge circuits.

Figure 6:
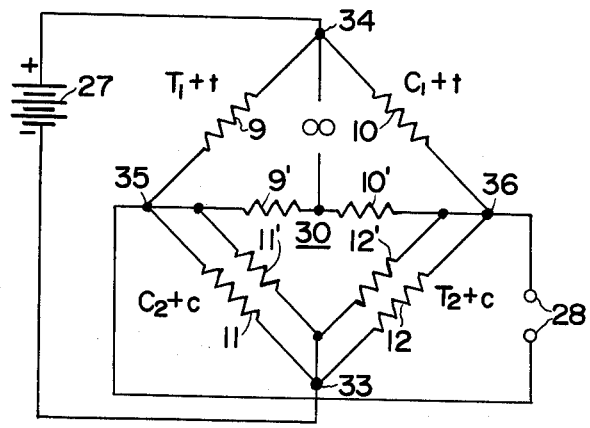
FIG. 6 illustrates two bridge circuits connected in parallel in accordance with the invention.

With the above background information in mind, and with reference to FIG. 6, the invention eliminates the above problem completely by wiring parallel bridged circuits of transducers as shown in FIG. 6. By rotating, so to speak, the measured signal output terminals 35 and 36 as well as the power input terminals 33 and 34 by 90°, the interaction is eliminated. When the potentiometer 29 is opened to infinity as shown in FIG. 6, the strain gauges 11 and 12 which are shunted by other strain gauges 11' and 12" both sense the couple related compression components "c". As a result, the potentials at the points 35 and 36 do not move relative to each other, and no output component is added to the measured signal as a result of the pressure of the couple related components "t" and "c". Tests in the laboratory have shown that the interaction has been reduced according to the invention by a factor exceeding 50 to 1 as compared to the above described conventional bridge circuit configuration shown in FIGS. 5a and 5b.

If the inner bridge 30 is removed in FIG. 6, substantially the same considerations apply as have been described above with reference to FIG. 3. In other words, the couple related components cancel, for the following reasons. The couple related component "c" causes a potential reduction at the junciton 35, since the strain gauge 9 increases in resistance due to the tensile component "t" while the strain gauge 11 decreases in resistance due to the compressive component "c". The same happens at the junction 36 on the other side of the bridge. The potential at 36 is lowered due to the respective couple related components "t" and "c" to the same extent as the potential at 35. Hence, the couple related components "t" and "c" do not cause any respective output signal components and, as mentioned, the same effect as in FIG. 3 is obtained if the inner bridge 30 is removed in FIG. 6.

However, when two bridge circuits are connected in parallel and the potentiometer 29 is open circuited, the strain gauge 11 is shunted by the strain gauge resistor 11' which has the same resistance. Further, the strain gauge 12 is shunted by the gauge 12' which also has the same resistance. As a result, the potential at the junction 35 between the gauge 9 and the gauge 11 still decreases somewhat but not quite as much as before in FIG. 5b because the gauge 11 which measures $C_2 + c$ is shunted by the strain gauge 11' having the same resistance. Further, the same situation applies with regard to the strain gauge 12 which measures $T_2 + c$ whereby the potential at the junction 36 also does not decrease as much as in FIG. 5b due to the shunting of gauge 12 by gauge 12'. Both components 11 and 12 do not decrease in potential as much as in FIG. 5b and the potential decreases are by the same amount. Hence, the measured output signal appearing at the terminals 35, 36, does not include an output component due to the couple related loads "t" and "c".

The circuit configuration according to the invention as shown in FIG. 5 has been tested and it has been found that the above described interaction has been substantially reduced by a factor exceeding 50 to 1 as compared to the interaction encountered in the circuit arrangement of FIG. 5b. This surprising improvement has been accomplished by rewiring the bridge without the need for any additional circuit components. Accordingly, the costs of the transducers is not affected, yet substantial savings are involved in eliminating the sensitivity adjustments heretofore required when transducers were installed in sets such as in a weighing scale. Thus, the over-all improvement is very substantial.

Referring again to FIG. 6, each individual bridge circuit comprises the above mentioned four strain gauges 9, 10, 11, 12 in the outer bridge circuit and 9', 10', 11', and 12' in the inner bridge circuit 30. The strain gauges 9 and 9' sense in addition to the load produced tension strain $T_1$ the tension strains related to the force couple. The strain gauges 10 and 10' sense in addition to the compression strain $C_1$ caused by the load, the tension strain related to the force couple. The strain gauges 11 and 11' sense the load caused compression strain $C_2$ and the force couple related compression strain c. The strain gauges 12 and 12' measure the tension strain $T_2$ caused by the load T and the compression strain "c" caused by the force couple.

According to the invention the arrangement is such that the strain gauges in the two upper half bridges sense in addition to the load caused strains, the tension strains "t" caused by the force couple and that the two lower half bridges sense, in addition to the strains caused by the load, the compression strains "c" caused by the force couple.

The upper half bridge of the outer bridge circuit comprises the strain gauges 9 and 10 which are connected in series relative to the measured signal output terminals 35 and 36. The upper half bridge of the inner bridge circuit comprises the strain gauges 9' and 10' and is connected in parallel to the series connection of the strain gauges 9 and 10. In the lower half bridges the gauges 11 and 11' form a parallel bridge section and the gauges 12 and 12' form another parallel bridge section. The two parallel bridge sections are connected in series with each other and to the terminals 35 and 36. The power input is connected to the junction 33 and to the junction 34. As a result of this circuit configuration according to the invention the strain gauges which sense the tension component related to the force couple increase in resistance whereas the strain gauges which sense the compression component related to the force couple decrease in resistance by the same value so that the measured output signal is free of any force couple related signal component.

Although the invention has been described with reference to the example of bending beam transducers, it will be appreciated, that the invention is also applicable to shear beam transducers which primarily sense shear loads as well as superimposed loads due to strains resulting from the respective force couple resulting in respective bending loads. The foregoing analysis also applies to the shearing beam transducer.

Although the invention has been described with reference to specific example embodiments, it will be appreciated, that it is intended to cover all modifications and equivalents within the scope of the appended claims.

What is claimed is:

1. In a transducer bridge circuit arrangement comprising at least two individual bridge circuits each of which includes its respective strain gauges, means connecting said bridge circuits in parallel to each other, common power input terminals and common measured signal output terminals forming part of said parallel connected bridge circuits, and resistance means conencted in series with the respective power input terminals of the corresponding bridge circuit for adjusting the relative sensitivity of each individual bridge circuit, the improvement wherein each individual bridge circuit comprises a plurality of strain gauge means which sense tensile strains, compressive strains, or mixed tensile and compressive strains, and wherein one of said common power input terminals (34) is operatively connected on one side to tension only sensing strain gauge means (9, 9') while the other common power input terminal (33) is operatively connected on one side to compression only sensing strain gauge means (11, 11'), whereas the other side of both power input terminals (33,34) is operatively connected to mixed strains sensing strain gauge means (10, 10'; 12, 12'), and wherein one of said common measured signal output terminals (35) is operatively connected between tension only and compression only sensing strain gauge means (9, 9'; 11, 11'), whereas the other common measured signal output terminal (36) is operatively connected between mixed strains sensing strain gauge means (10, 10'; 12, 12'), whereby the relative sensitivity of each individual bridge circuit may be adjusted substantially without interaction among said individual bridge circuits.

2. The transducer bridge circuit arrangement of claim 1, wherein each individual bridge circuit comprise four strain gauges, wherein one (34) of said common power input terminals is arranged between a tension sensing strain gauge (9) and a compression as well as tension sensing strain gauge (10), whereas the other power input terminal (33) is arranged between a compression sensing strain gauge (11) and a tension as well as compression sensing strain gauge (12), and wherein one (35) of said common measured signal output terminals is arranged between a tension sensing strain gauge (9) and a compression sensing strain gauge (11) while the other measured signal output terminal (36) is arranged between tension and compression sensing strain gauges (10, 12) whereby sensitivity adjustments of any individual bridge remain substantially without effect on the sensitivity of any other individual bridge circuit.

3. The transducer bridge circuit arrangement of claim 1, wherein each individual bridge circuit comprises four strain gauges of which a first strain gauge (9) senses tension strains only, a second strain gauge (10) senses compression strains and tension strains, a third strain gauge (12) senses tension strains and compression strains only, said circuit arrangement comprising means connecting said first (9) and second (10) strain gauges to each other, whereby said tension sensing strain gauge (9) and said compression and tension sensing strain gauge (10) form one terminal (34) of said power input terminals, second means connecting said third (12) and fourth (11) strain gauges to each other whereby said tension and compression sensing strain gauge (12) and said compression sensing strain gauge (11) form the second power input terminal (33), third means connecting said first (9) and fourth (11) strain gauges to each other to form one measured signal output terminal (35), and fourth means connecting said second (10) and third (12) strain gauges to each other to form the other measured signal output terminal (36), whereby interaction between the individual bridge circuits is eliminated.

4. The transducer bridge circuit arrangement of claim 1, wherein each of said individual bridge circuits comprises four strain gauges (9, 10, 11, 12; and 9', 10', 11', 12'), wherein two first strain gauges (9,10; 9', 10') of each bridge circuit sense, in addition to the load produced strains, tension strains related to said force couple, and wherein two second strain gauges (11, 12; 11', 12') of each bridge circuit sense, in addition to the load produced strains, compression strains related to said force couple, said bridge circuit arrangement further comprising means connecting said two first strain gauges (9, 10; 9', 10') of each bridge circuit in series to form two series connected half bridges which are connected in parallel with each other, means connecting each of said two second strain gauges of each bridge circuit in parallel to the corresponding second strain gauge of the other bridge circuit to form two parallel bridge sections which are connected in series with each other, means interconnecting said half bridges and said series connected bridge sections to form first and second junctions (35, 36) constituting said measured signal output terminals, wherein a third junction (34) is formed intermediate the strain gauges of one of said half bridges, and wherein a fourth junction (33) is formed between the series connected, parallel bridge sections, said third and fourth junctions constituting said measured signal output terminals, whereby the strain gauges which sense the tension component related to said force couple increase in resistance whereas the strain gauges which sense the compression component related to said force couple decrease in resistance by the same value, so that the measured output signal is free of any force couple related signal component.

* * * * *